(12) United States Patent
Zhou et al.

(10) Patent No.: US 9,805,809 B1
(45) Date of Patent: Oct. 31, 2017

(54) STATE-DEPENDENT READ COMPENSATION

(71) Applicant: SanDisk Technologies LLC, Plano, TX (US)

(72) Inventors: Zhenming Zhou, San Jose, CA (US); Guirong Liang, Santa Clara, CA (US); Gerrit Jan Hemink, San Ramon, CA (US); Dana Lee, Saratoga, CA (US); Chandu Gorla, Sunnyvale, CA (US); Sarath Puthenthermadam, San Jose, CA (US); Deepanshu Dutta, Fremont, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 15/253,864

(22) Filed: Aug. 31, 2016

(51) Int. Cl.
| | |
|---|---|
| *G11C 16/00* | (2006.01) |
| *G11C 16/26* | (2006.01) |
| *G11C 16/04* | (2006.01) |
| *G11C 16/16* | (2006.01) |
| *G11C 16/08* | (2006.01) |

(52) U.S. Cl.
CPC .......... *G11C 16/26* (2013.01); *G11C 16/0433* (2013.01); *G11C 16/0483* (2013.01); *G11C 16/08* (2013.01); *G11C 16/16* (2013.01)

(58) Field of Classification Search
CPC . G11C 16/26; G11C 16/0433; G11C 16/0483; G11C 16/06; G11C 16/08; G11C 16/16
USPC ............. 365/185.21, 185.17, 185.02, 185.03
See application file for complete search history.

(56) References Cited

U.S. PATENT DOCUMENTS

| | | | |
|---|---|---|---|
| 7,551,477 B2 | 6/2009 | Mokhlesi et al. | |
| 7,778,106 B2 | 8/2010 | Mokhlesi | |
| 7,876,611 B2 | 1/2011 | Dutta et al. | |
| 8,169,822 B2 | 5/2012 | Dutta et al. | |
| 8,374,028 B2* | 2/2013 | Zhao ................... | G11C 11/5642 365/185.02 |
| 8,737,129 B2 | 5/2014 | Lee et al. | |
| 8,767,468 B2 | 7/2014 | Lee et al. | |
| 8,909,493 B2 | 12/2014 | Avila et al. | |
| 8,964,476 B2 | 2/2015 | Shim et al. | |
| 9,117,495 B2 | 8/2015 | Siau et al. | |
| 9,202,579 B2 | 12/2015 | Hsiung et al. | |
| 2007/0153583 A1 | 7/2007 | Guterman | |
| 2010/0074026 A1 | 3/2010 | Kang | |

(Continued)

OTHER PUBLICATIONS

PCT International Application No. PCT/US2017/033300 International Search Report and Written Opinion dated Aug. 9, 2017.

*Primary Examiner* — Tan T. Nguyen
(74) *Attorney, Agent, or Firm* — Kunzler, PC

(57) ABSTRACT

Apparatuses, systems, methods, and computer program products are disclosed for state-dependent read compensation. A set of non-volatile storage cells comprising a plurality of word lines. A controller is configured to perform a read operation on one or more word lines adjacent to a target word line. A controller is configured to determine a read setting for application to a target word line based on a result of a read operation on one or more word lines adjacent to the target word line. A controller is configured to perform a read operation on a target word line using a determined read setting.

18 Claims, 12 Drawing Sheets

(56) References Cited

U.S. PATENT DOCUMENTS

| | | | |
|---|---|---|---|
| 2012/0250414 A1* | 10/2012 | Khandelwal | G11C 16/26 365/185.17 |
| 2013/0070524 A1* | 3/2013 | Dutta | G11C 11/5642 365/185.03 |
| 2014/0254262 A1* | 9/2014 | Chen | G11C 16/0483 365/185.03 |
| 2016/0005491 A1* | 1/2016 | Yuan | G11C 11/5642 365/185.02 |
| 2016/0093390 A1* | 3/2016 | Yuan | G11C 16/3427 714/764 |

* cited by examiner

US 9,805,809 B1

STATE-DEPENDENT READ COMPENSATION

TECHNICAL FIELD

The present disclosure, in various embodiments, relates to storage devices and more particularly relates to state-dependent read compensation for storage devices.

BACKGROUND

Many data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

The data-encoding physical property of a cell may vary over time due to cell damage, charge leakage, temperature effects, disturbances from nearby cells, manufacturing differences, or the like. Certain architectural properties of a cell may make a cell susceptible to lateral charge diffusion. As storage density increases, feature size shrinks, making the cells more susceptible to such differences.

SUMMARY

Apparatuses are presented for state-dependent read compensation. In one embodiment, an apparatus includes a set of non-volatile storage cells comprising a plurality of word lines. A controller, in certain embodiments, is configured to perform a read operation on one or more word lines adjacent to a target word line. A controller, in one embodiment, is configured to determine a read setting for application to a target word line based on a result of a read operation on one or more word lines adjacent to the target word line. In some embodiments, a controller is configured to perform a read operation on a target word line using a determined read setting.

Methods are presented for state-dependent read compensation. A method, in one embodiment, includes performing a first read on a first word line using a first read level. In a further embodiment, a method includes performing a second read on a second word line using a second read level. In various embodiments, performing a first read overlaps in time with performing a second read. A method, in certain embodiments, includes determining a read setting for application to a third word line for a third read on the third word line based at least partially on results of first and second reads. In some embodiments, a first word line is adjacent to a third word line, and a third word line is adjacent to a second word line. In some embodiments, a method includes performing a third read on a third word line using a read setting.

An apparatus for state-dependent read compensation, in one embodiment, includes means for performing a first read on a first set of cells physically adjacent to a selected set of cells, the first set of cells sharing a charge trapping layer with the selected set of cells. In certain embodiments, an apparatus includes means for determining one or more of a sense time and a source voltage for a second read on a selected set of cells based on a first read. In some embodiments, an apparatus includes means for performing a second read on a selected set of cells using a determined one or more of a sense time and a source voltage.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
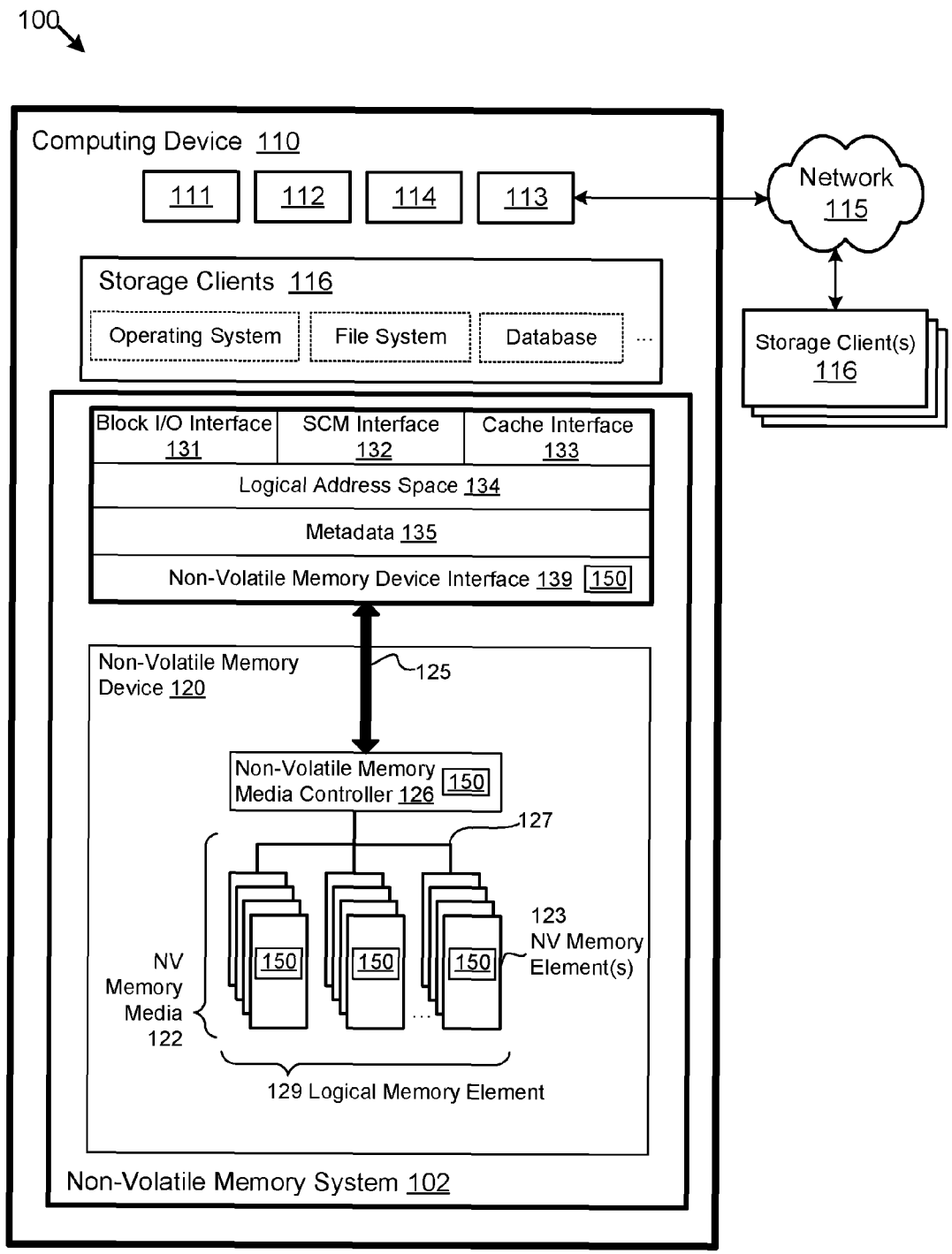
FIG. 1A is a schematic block diagram illustrating one embodiment of a system for state-dependent read compensation.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a read compensation component 150 for a non-volatile memory device 120. The read compensation component 150 may be part of and/or in communication with a non-volatile memory media controller 126, a non-volatile memory element 123, a device driver, or the like. The read compensation component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the read compensation component 150 may be embodied as one or more computer readable instructions stored on the non-transitory storage medium 114.

The non-volatile memory system 102, in the depicted embodiment, includes a read compensation component 150. The read compensation component 150, in one embodiment, is configured to manage a sequence of reading data for the non-volatile memory device 120 described below. The read compensation component 150, in certain embodiments, may perform a read operation on one or more word lines adjacent to a target word line. The read compensation component 150 may also determine a read setting for the target word line based on a result of the read operation on the one or more word lines adjacent to the target word line. The read compensation component 150 may perform a read operation on the target word line using the determined read setting. Thus, lateral charge diffusion may be compensated for during a read.

In one embodiment, the read compensation component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the read compensation component 150 may comprise executable software code, such as a device driver or the like, stored on the computer readable storage medium 114 for execution on the processor 111. In a further embodiment, the read compensation component 150 may include a combination of both executable software code and logic hardware.

In one embodiment, the read compensation component 150 is configured to receive storage requests from a device driver or other executable application via a bus 125 or the like. The read compensation component 150 may be further configured to transfer data to/from a device driver and/or storage clients 116 via the bus 125. Accordingly, the read compensation component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the read compensation component 150 may receive storage requests as an API call from a storage client 116, as an IO-CTL command, or the like.

According to various embodiments, a non-volatile memory controller 126 in communication with one or more program sequencing components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . , WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
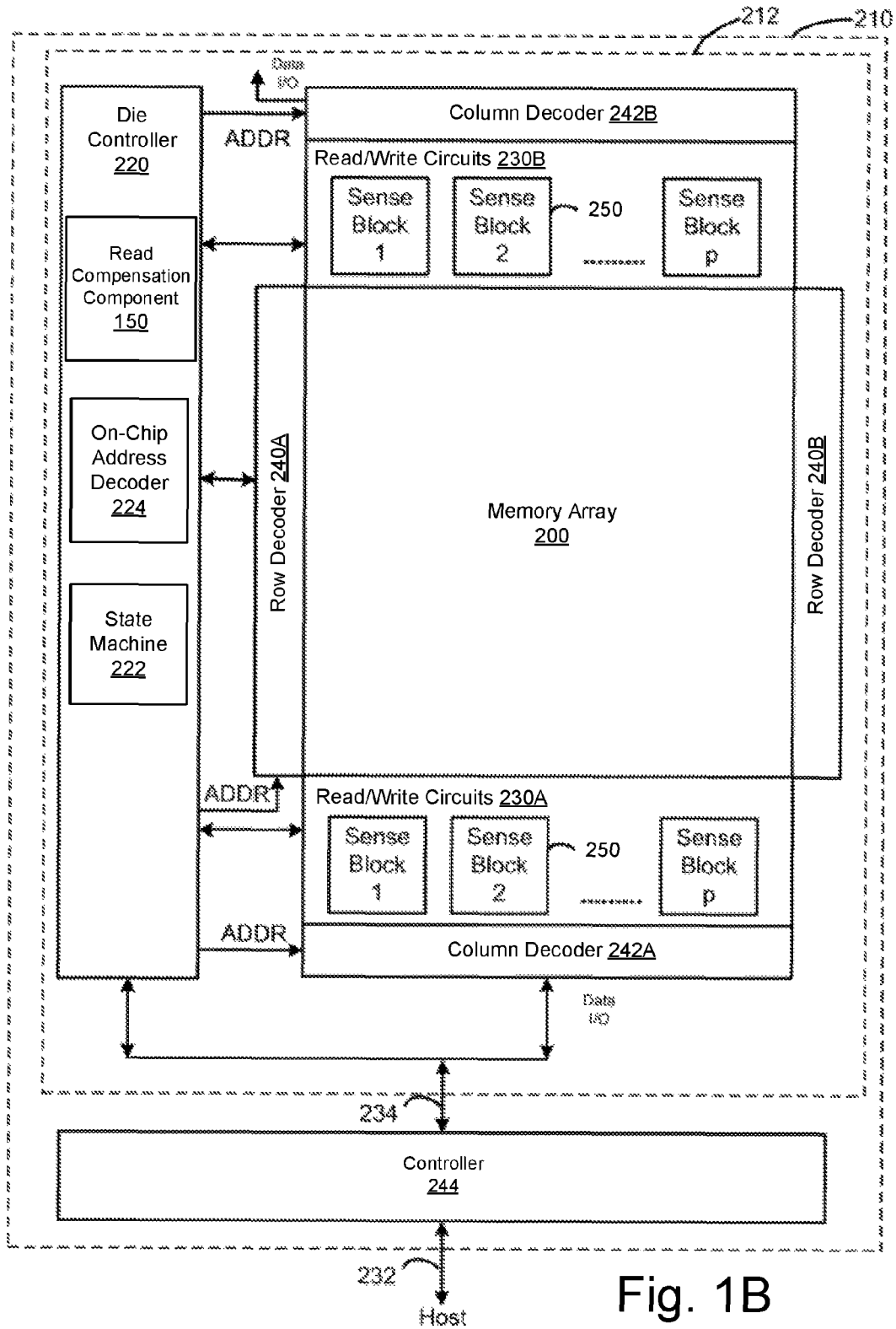
FIG. 1B is a schematic block diagram illustrating another embodiment of a system for state-dependent read compensation.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a read compensation component 150, a state machine 222, and an on-chip address decoder 224. In one embodiment, the state machine 222 comprises at least a portion of the read compensation component 150. In a further embodiment, the controller 244 comprises at least a portion of the read compensation component 150.

The read compensation component 150, in one embodiment, is configured to perform a first read on a first word line using a first read level, performing a second read on a second word line using a second read level, determine a read setting for a third read on a third word line based at least partially on results of the first and second reads, and perform the third read on the third word line using the read setting. In such an embodiment, performing the first read overlaps in time with performing the second read, the first word line is adjacent to the third word line, and the third word line is adjacent to the second word line.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the read compensation component 150. The read compensation component 150, in some embodiments, determines a read setting for reading a word line based on one or more reads of word lines adjacent to the word line. The read compensation component 150, in certain embodiments, is embodied as software in a device driver, hardware in a device controller 244, and/or hardware in a die controller 220 and/or state machine 222.

In one embodiment, one or any combination of die controller 220, read compensation component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
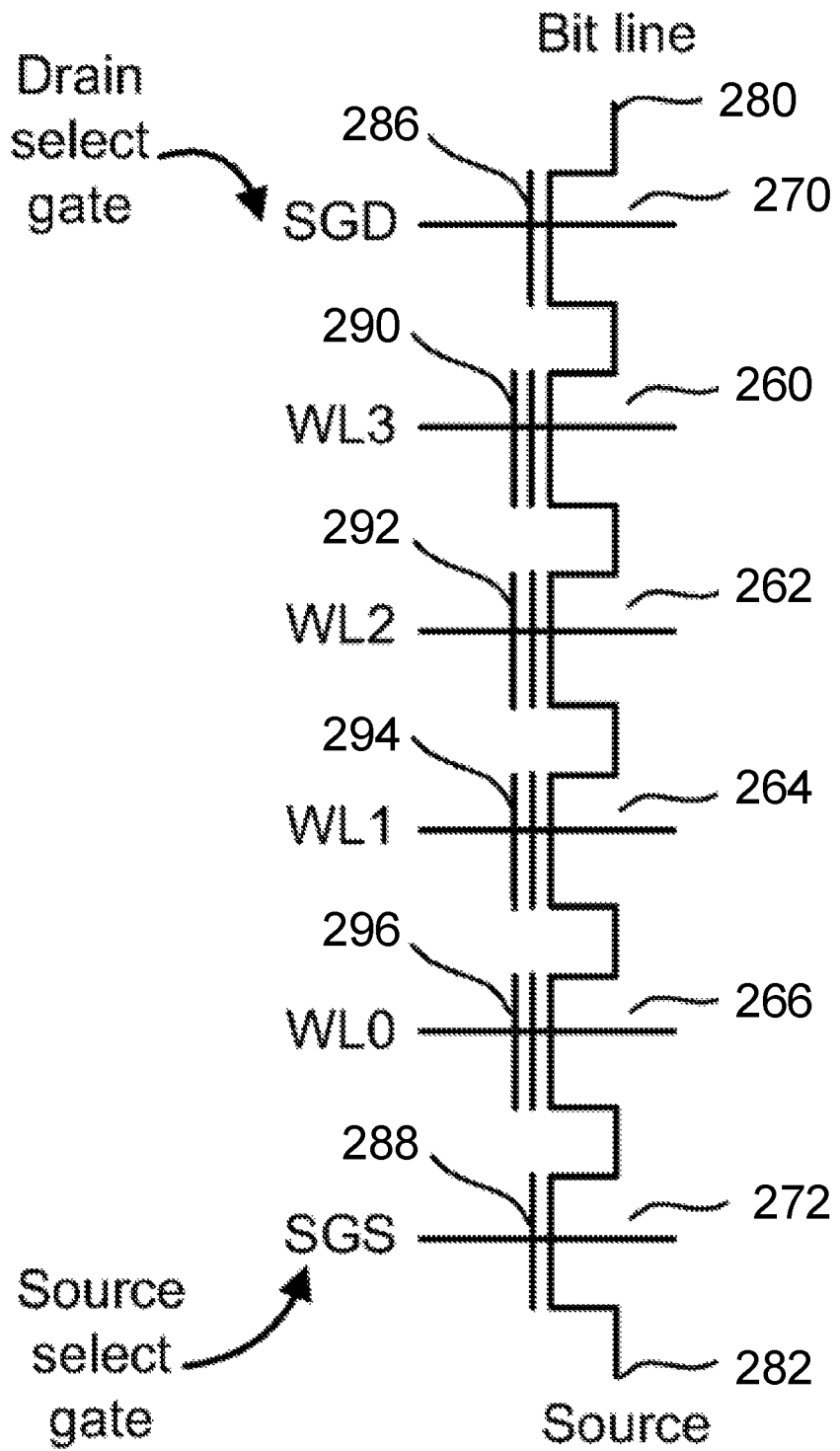
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the read compensation component 150 determines a read setting for reading the storage elements 260, 262, 264, 266 (e.g., a read voltage, read current, and/or another read level). The read setting may be determined based on read results from storage elements adjacent to the storage elements 260, 262, 264, 266. In a further embodiment, the read compensation component 150 performs a read on storage elements 260, 262, 264, 266 by applying the read setting.

Figure 3:
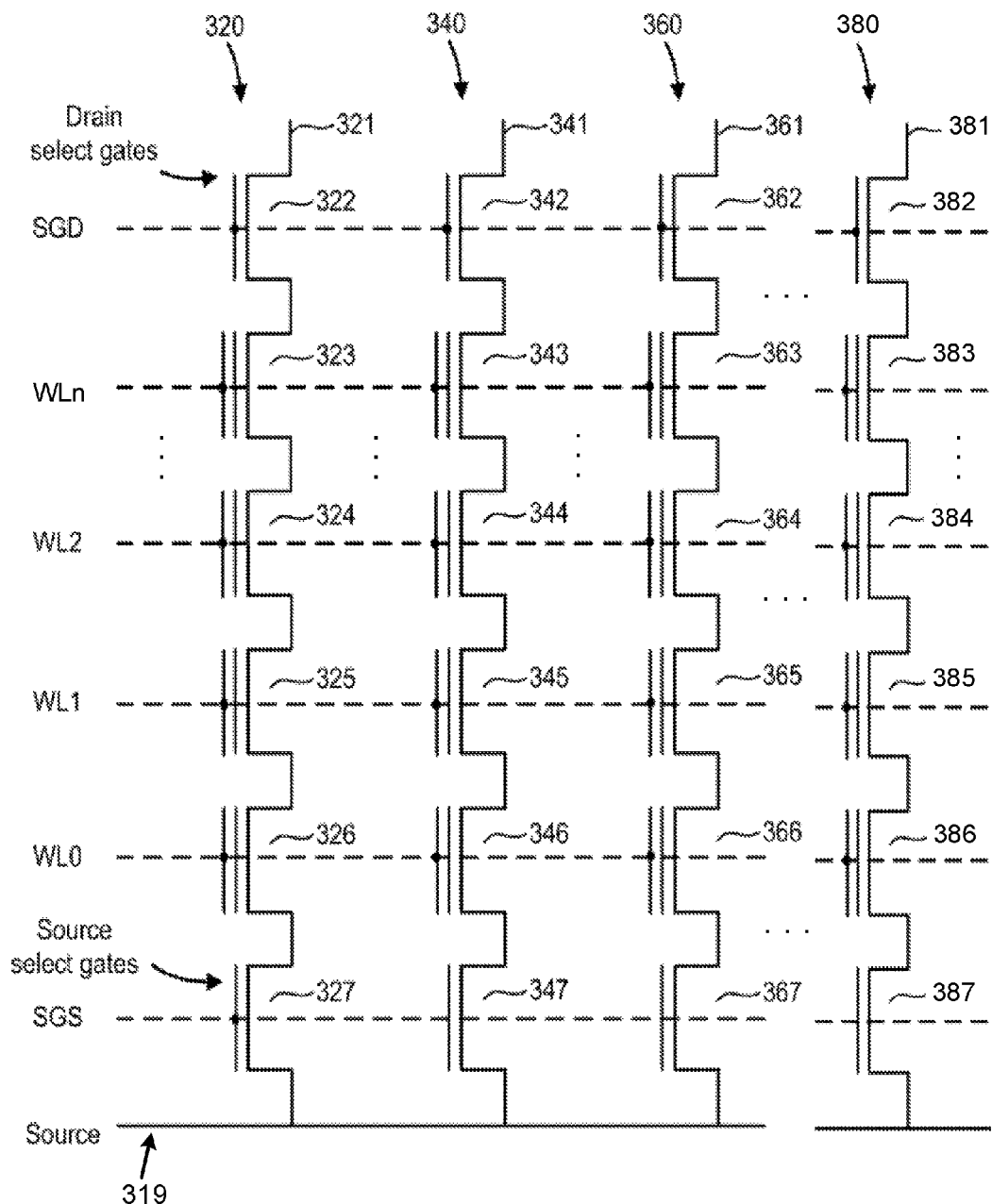
FIG. 3 is a schematic block diagram illustrating one embodiment of an array of storage cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements, e.g., thirty-two, sixty-four, or the like storage elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges which are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, when a read is performed, lateral diffusion from one or more neighboring storage elements 323-326, 343-346, 363-366, 383-386 may occur, which may be a result of different storage states of the one or more storage elements 323-326, 343-346, 363-366, 383-386 and/or different storage states of elements adjacent to the one or more storage elements 323-326, 343-346, 363-366, 383-386. In such an embodiment, the read compensation component 150 may adjust a read setting applied to the one or more storage elements 323-326, 343-346, 363-366, 383-386 based on different storage states of the one or more storage elements 323-326, 343-346, 363-366, 383-386 and/or different storage states of elements adjacent to the one or more storage elements 323-326, 343-346, 363-366, 383-386.

Figure 4:
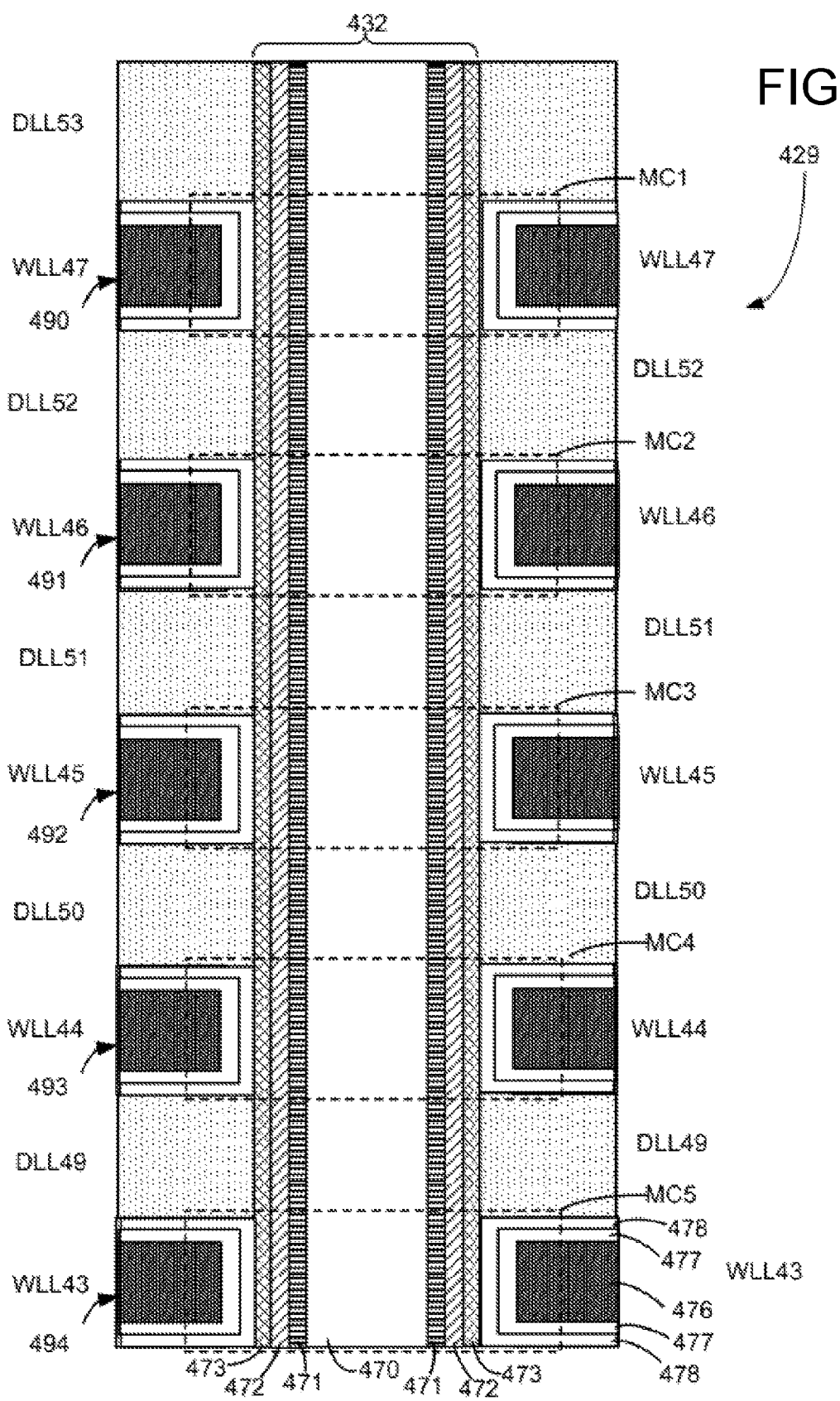
FIG. 4 illustrates one embodiment of a 3D, vertical NAND flash memory structure.

FIG. 4 illustrates one embodiment of a crosssectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
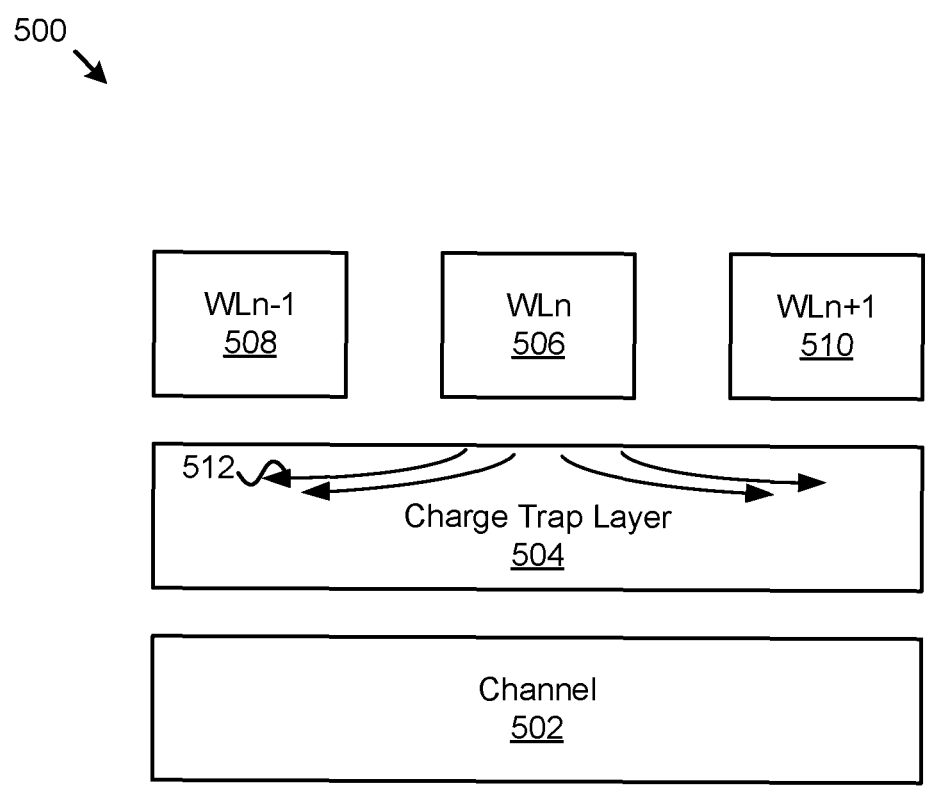
FIG. 5 is a schematic block diagram illustrating one embodiment of a device that may use state-dependent read compensation.

FIG. 5 is a schematic block diagram illustrating one embodiment of a device 500 that may use state-dependent read compensation. The device 500 includes a channel 502 (e.g., poly silicon channel) with a charge trap layer 504 disposed over the channel 502. Moreover, a first word line 506 ("WLn"), a second word line 508 ("WLn−1"), and a third word line 510 ("WLn+1") are disposed over the charge trap layer 504. The second word line 508 is adjacent to, and before, the first word line 506 in a word line order, and the third word line 510 is adjacent to, and after, the first word line 506 in the word line order. In certain embodiments, the second word line 508 and/or the third word line 510 may have a lower storage state than the first word line 506. In such embodiments, lateral diffusion 512 may occur between neighboring cells while the first word line 506 is read thereby resulting in a lower read voltage for the first word line 506. In some embodiments, the lateral diffusion 512 may be greatest while the second word line 508 and/or the third word line 510 are in an erased state.

Figure 6:
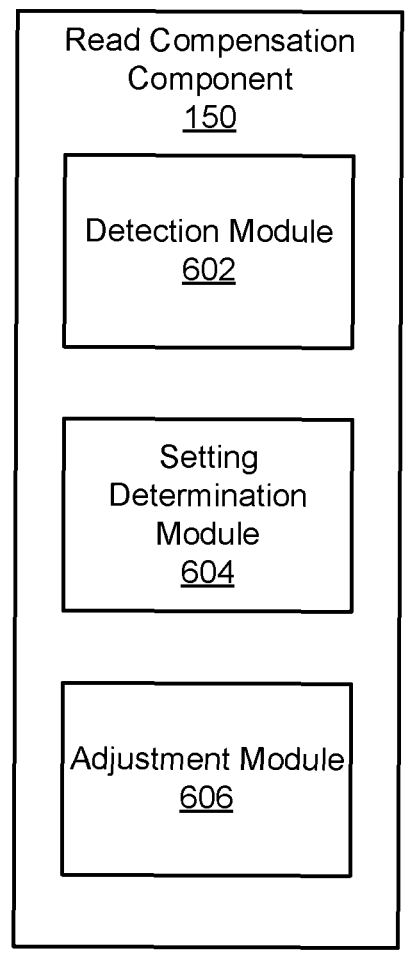
FIG. 6 is a schematic block diagram illustrating one embodiment of a read compensation component.

FIG. 6 depicts one embodiment of a read compensation component 150. The read compensation component 150 may be substantially similar to the read compensation component 150 described above with regard to FIGS. 1A, 1B, 2, and/or 3. In general, as described above, the read compensation component 150 determines a read setting for a memory cell based on a prior read of one or more memory cells adjacent to the memory cell and performs a read on the memory cell using the read setting. In the depicted embodiment, the read compensation component 150 includes a detection module 602, a setting determination module 604, and an adjustment module 606.

In various embodiments, the detection module 602 performs a read operation on one or more word lines adjacent to a target word line. In certain embodiments, the detection module 602 performs a first read on a first word line using a first read level. In some embodiments, the detection module 602 performs a second read on a second word line using a second read level. A read level may be, in various embodiments, a read voltage applied to a word line, a bit line voltage (e.g., a bit line bias voltage used during a read operation), a read current, a sense time for a sense amplifier, and/or some other level or input used to read information stored in the one or more storage cells. In one embodiment, performing the first read overlaps in time with performing the second read. In various embodiments, the first read level and the second read level are the same. In some embodiments, the target word line is adjacent to both of the first and second word lines. For example, in one order of word lines, the first word line (e.g., WLn−1 508) may be followed by the target word line (e.g., a third word line, WLn 506), and the target word line may be followed by the second word line (e.g., WLn+1 510). In another example, an order of word lines may include the second word line (e.g., WLn+1 510) followed by the target word line (e.g., WLn 506), and the target word line followed by the first word line (e.g., WLn−1 508).

In various embodiments, one or more of performing the first read and performing the second read includes performing a plurality of reads using a plurality of read levels to detect a storage state of storage cells. For example, in one embodiment, there may be four possible storage states for the first word line and four possible storage states for the second word line. In such an example, three reads may be performed on the first word line and/or three reads may be performed on the second word line to determine the storage states of the first and second word lines. As another example, in one embodiment, there may be eight possible storage states for the first word line and eight possible storage states for the second word line. In such an example, seven reads may be performed on the first word line and/or seven reads may be performed on the second word line to determine the storage states of the first and second word lines. In one embodiment, the reads of the first and second word lines may be performed concurrently, while, in another embodiment, the reads of the first and second word lines may be performed separately. For example, in certain embodiments, performing the first read on the first word line using the first read level and performing the second read on the second word line using the second read level includes concurrently applying a first read voltage (e.g., approximately 0.3 volts) to the first and second word lines (e.g., WLn−1 508, WLn+1 510). In one embodiment, a second read voltage (e.g., approximately 6.0 volts) is applied to at least a third word line (e.g., WLn 506) adjacent to the first and second word lines while reading the first and/or second word lines.

In one embodiment, the detection module 602 performs a first read on a first word line using a first read level and determines whether storage cells of the first word line are in an erase state, and the detection module 602 performs a second read on a second word line using a second read level and determining whether storage cells of the second word line are in the erase state. In certain embodiments, the detection module 602 concurrently applies a first read voltage (e.g., approximately 0.3 volts) to a first word line and a second read voltage (e.g., approximately 6.0 volts) to at least second and third word lines to perform a first read on the first word line. In some embodiments, the detection module 602 concurrently applies a first read voltage (e.g., approximately 0.3 volts) to a second word line and a second read voltage (e.g., approximately 6.0 volts) to at least first and third word lines.

Referring to FIG. 5, in one embodiment, the detection module 602 may perform a read of memory cells of the second word line 508 and the third word line 510 concurrently. This concurrent read may be performed to detect whether memory cells on both of the second word line 508 and the third word line 510 are in an erase state. The result from reading the second and third word lines 508, 510 together may indicate that memory cells on the second and third word lines 508, 510 are both in the erase state, or that memory cells on the second and third word lines 508, 510 are not both in the erase state (e.g., at least one of the memory cells is in a programmed state). Accordingly, if memory cells on only one of the first and second word lines 508, 510 are in the erase state, the detection module 602 will not detect such by concurrently performing a read of memory cells on the second and third word lines 508, 510. It should be noted that, in one embodiment, a worst case condition of lateral diffusion exists if the memory cells of both the second and third word lines 508, 510 are in the erase state. Thus, by concurrently reading memory cells of the second and third word lines 508, 510, a worst case condition may be detected. Furthermore, concurrently reading the memory cells of the second and third word lines 508, 510 is performed using a single read, thereby taking a length of time corresponding to a single read cycle. However, concurrently reading the memory cells of the second and third word lines 508, 510, in certain embodiments, may not indicate a memory state of the second and third word lines 508, 510, other than the erase state if memory cells of both the second and third word lines 508, 510 are in the erase state.

For example, to read the memory cells of both the second and third word lines 508, 510 concurrently, a voltage of approximately 0.3 volts may be provided to the second and third word lines 508, 510, and a voltage of approximately 6.0 volts may be provided to the first word line 506. If the memory cells of the second and third word lines 508, 510 are in the erase state, a transistor corresponding to the memory cells will be conductive indicating that the memory cells of the second and third word lines 508, 510 are in the erase state. Because a voltage of approximately 6.0 volts is provided to the first word line 506, a transistor corresponding to a memory cell of the first word line 506 will not be conductive because any memory state that may be stored on the memory cell of the first word line 506 is less than approximately 6.0 volts.

Again referring to FIG. 5, in some embodiments, the detection module 602 may perform a read of memory cells of the second word line 508 and the third word line 510 separately. This separate read may be performed to detect whether memory cells on one or both of the second word line 508 and the third word line 510 are in an erase state, or a programmed state. The result from reading the second and third word lines 508, 510 separately may indicate that memory cells on the second and third word lines 508, 510 are both in the erase state, that only one of the memory cells on the second and third word lines 508, 510 is in the erase state, or that memory cells of both of the second and third word lines 508, 510 are in a programmed state. Moreover, separately reading the memory cells of the second and third word lines 508, 510 may be performed to determine which programmed state memory cells are in. In one embodiment, a second worst case condition of lateral diffusion exists if the memory cells of one of the second and third word lines 508, 510 is in the erase state. Thus, by reading memory cells of the second and third word lines 508, 510 separately, a second worst case condition may be detected. Furthermore, reading the memory cells of the second and third word lines 508, 510 to determine which memory cells are in an erase state is performed using two reads, thereby taking a length of time corresponding to two read cycles. Reading the memory cells of the second and third word lines 508, 510 to determine each additional state will take an additional one read per word line. For example, to determine whether the memory cells of the second and third word lines 508, 510 are in an erase state, or a first programmed state will take a total of four reads.

In one embodiment, to read a memory cell of the second word line 508, a voltage of approximately 0.3 volts may be provided to the second word line 508, and a voltage of approximately 6.0 volts may be provided to the first and third word lines 506, 510. If the memory cell of the second word line 508 is in the erase state, a transistor corresponding to the memory cell will be conductive indicating that the memory cell of the second word line 508 is in the erase state. Because a voltage of approximately 6.0 volts is provided to the first and third word lines 506, 510 transistors corresponding to memory cells of the first and third word lines 506, 510 will not be conductive because memory states that may be stored on the memory cells of the first and third word lines 506, 510 are all less than approximately 6.0 volts.

Returning to FIG. 6, in certain embodiments, the setting determination module 604 determines a read setting for application to a target word line based on a result of a read operation on one or more word lines adjacent to the target word line. In some embodiments, the read setting includes a cell source voltage and/or a sense time. By adjusting the cell source voltage and/or the sense time, the voltage read from the target word line may be compensated for any lateral diffusion that may occur based on the one or more word lines adjacent to the target word line.

In various embodiments, instead of or, in addition to, a cell source voltage and/or a sense time, the read setting may include one or more bit line inputs, such as bit line voltages (e.g., voltage biases) or the like. In embodiments in which the read setting includes multiple bit line voltages, the bit line voltages may be concurrently applied and may be different from one another. For example, a first one or more bit lines may have a first voltage applied, while a second one or more bit lines may have a second voltage applied, with the first voltage being different from the second voltage.

In certain embodiments, a first one or more bit lines may have a high bit line voltage applied (e.g., for three read voltage thresholds for different states, three different successively higher voltages), while a second one or more bit lines may have a low bit line voltage applied (e.g., for three read voltage thresholds for different states, three lower voltages than for the first one or more bitlines, also successively higher). In some embodiments, different sets of multiple bit line voltages may be used for reading each state that storage cells may have stored thereon. For example, a first one or more bit lines may have a first high bit line voltage applied, while concurrently a second one or more bit lines may have a first low bit line voltage applied to read a first state of storage cells; next the first one or more bit lines may have a second high bit line voltage applied, while concurrently the second one or more bit lines may have a second low bit line voltage applied to read a second state of storage cells; next the first one or more bit lines may have a third high bit line voltage applied, while concurrently the second one or more bit lines may have a third low bit line voltage applied to read a third state of storage cells; and so forth. For example, a set of high bit line voltages may be used for storage cells of a target word line that are adjacent to storage cells in a neighboring word line (e.g., WLn+1) in a storage state above a threshold (e.g., one of the three highest states out of eight states, a stored read voltage level above a predetermined threshold, or the like) and a set of low bit line voltages may concurrently be used for storage cells of the target word line that are adjacent to storage cells in the neighboring word line in a storage state below the threshold (e.g., one of the five lowest states out of eight states, a stored read voltage level below a predetermined threshold, or the like).

In one embodiment, concurrent bit line voltages may be determined based on a result of the read operation of one or more word lines adjacent to the target word line. In certain embodiments, the read setting includes multiple sense times. The sense times may be used for specific bit lines based on a result of the read operation of one or more word lines adjacent to the target word line.

As used herein, a bit line input may be a voltage, a current, and/or another input for a bit line of one or more storage cells, based on an architecture (e.g., NAND flash or other charge trapping storage, resistive storage such as ReRAM or Memristor memory, or the like) of cells, based on an operation being performed (e.g., read, erase, program, or the like), and/or on another factor. A bit line input may be applied to a bit line of one or more storage cells during a read operation, to bias the bit line to a certain level. For example, for NAND flash and/or another charge trapping storage technology, a read operation may use a parasitic capacitance of the bit line as part of a read operation by pre-charging the bit line to a bit line voltage. A nominal or default bit line voltage for a read operation, in one embodiment, may be about 0.2 volts, about 0.5 volts, about 1.0 volts, and/or another predefined voltage level.

During the read operation, if the storage cell is erased or has a stored threshold voltage below a read voltage threshold applied to the word line (e.g., to the control gate of the storage cell), in certain embodiments, the storage cell sinks current and discharges the bit line (e.g., an erased cell may have a negative threshold voltage). If the storage cell is programmed (e.g., has a threshold voltage above a read voltage threshold applied to the word line), it does not sink current and the bit line keeps its pre-charged, biased value. Sense amplifiers 250 may sense currents of bit lines (e.g., whether or not the cell is sinking current) for a selected word line of storage cells to determine the stored data values of the word line.

In one embodiment, a first storage state of one or more word lines adjacent to a target word line differs from a second storage state of the target word line by a threshold number of storage states. The threshold number of storage states may be 1, 2, 3, 4, 5, 6, 7, or more storage states. For example, in one embodiment, the threshold number of storage states may be 3 storage states. In certain embodiments, a first storage state of one or more word lines adjacent to a target word line is an erased state and a second storage state of the target word line is a programmed state. For example, a first and/or a second word line adjacent to the target word line may be in an erased state and the target word line may be in a programmed state. A storage state of a word line, as used herein, may refer to a word line that has a predetermined number of storage cells (or a predetermined percentage of storage cells or the like) at or below a threshold storage state. For example, a storage state of a word line may be considered to be in an erased state if a number of storage cells of the word line in an erased state is greater than a predetermined threshold. As another example, a storage state of a word line may be considered to be in an erased state if a percentage of storage cells of the word line in an erased state is greater than a predetermined percentage. In one embodiment, the predetermined percentage may be approximately 25%, 45%, 50%, 75%, 90%, or another suitable percentage.

In various embodiments, the setting determination module 604 determines a read setting by detecting that at least a threshold number of storage cells of the one or more word lines adjacent to the target word line are in an erase state based on the one or more read operations. In certain embodiments, the read setting includes setting a cell source voltage higher than a nominal cell source voltage level in response to detecting that at least a threshold number of storage cells of one or more of a first word line and a second word line are in an erase state. In some embodiments, the setting determination module 604 determines a read setting for a third read on a third word line based at least partially on results of the first and second reads. In such embodiments, the first word line is adjacent to the third word line, and the third word line is adjacent to the second word line.

In certain embodiments, the setting determination module 604 determines the read setting for a target word line by determining a first read setting for a first set of storage cells of the target word line having two adjacent storage cells in an erase state, determining a second read setting for a second set of storage cells of the target word line having one adjacent storage cell in the erase state, and/or determining a third read setting for a third set of storage cells of the target word line having two adjacent storage cells in a programmed state. Accordingly, in one embodiment, lateral diffusion may be compensated for based on the severity of its occurrence.

In certain embodiments, such as when a voltage bias 802 is applied to the channel 502, the first read setting may have a higher cell source voltage (e.g., higher voltage bias 802) than the second read setting, and the second read setting may have a higher cell source voltage than the third read setting due to lateral diffusion being greatest when adjacent memory cells are both in the erase state. In various embodiments, such as when a sense time bias 902 is used to read the target word line, the first read setting may have a shorter sense time (e.g., longer sense time bias 902) than the second read setting, and the second read setting may have a shorter sense time than the third read setting due to lateral diffusion being greatest when adjacent memory cells are both in the erase state.

In some embodiments, the adjustment module 606 performs a read operation on a target word line using a determined read setting. In one embodiment, the read setting includes a sense time, and the sense time is set lower than a nominal sense time to compensate for lateral diffusion. In various embodiments, the read setting includes a cell source voltage. In certain embodiments, the read setting merely adjusts how read results are interpreted by a processing device. For example, the read setting may indicate that the processing device is to apply an offset voltage to a read result.

In various embodiments, the adjustment module 606 may perform the read operation on the target word line using multiple different reads. For example, a first read may be performed on the target word line to read storage cells having two adjacent memory cells in an erase state, a second read may be performed on the target word line to read storage cells having one adjacent memory cell in the erase state, and/or a third read may be performed on the target word line to read storage cells having two adjacent memory cells in a programmed state. In some embodiments, the first read may be performed with a first read setting, the second read may be performed with a second read setting, and the third read may be performed with a third read setting. In some embodiments, one, two, three, four, or more reads may be performed as part of the read operation. Moreover, as used herein, the term read may refer to performing multiple reads. In certain embodiments, a part of a read may be used to refer to a read on a portion of storage cells of a word line.

Figure 8:
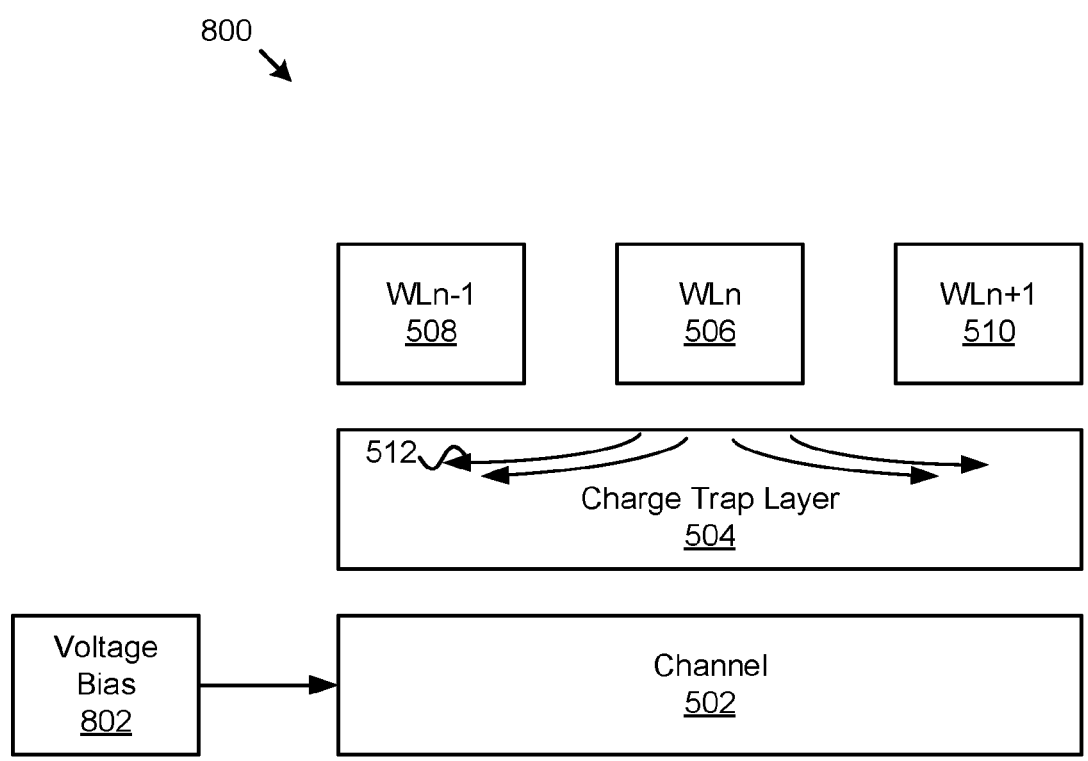
FIG. 8 is a schematic block diagram illustrating one embodiment of state-dependent read compensation.

Turning to FIG. 8, one embodiment of a device 800 is illustrated in which a voltage bias 802 is applied to the channel 502. In such an embodiment, the voltage bias 802 may be applied to the channel 502 in conjunction with a nominal cell source voltage to result in a total cell source voltage. In certain embodiments, the voltage bias 802 may be applied to one or more bit lines associated with the WLn 506 instead of, or in addition to, being applied to the channel 502. In such embodiments, the voltage bias 802 for one or more bit lines may be selected based on reads from one or more adjacent word lines. In some embodiments, the voltage bias 802 may be a voltage in a range of approximately 0 to 150 millivolts ("mv"), 50 to 250 mv, 200 to 500 mv, or more. In certain embodiments, the voltage bias 802 may be higher when word lines adjacent to a target word line (e.g., the word line being read) are in an erase state resulting in a higher total cell source voltage than a nominal cell source voltage. In one embodiment, the voltage bias 802 may be zero while word lines adjacent to the target word line are not in an erase state, such that the total cell source voltage matches the nominal cell source voltage.

Figure 9:
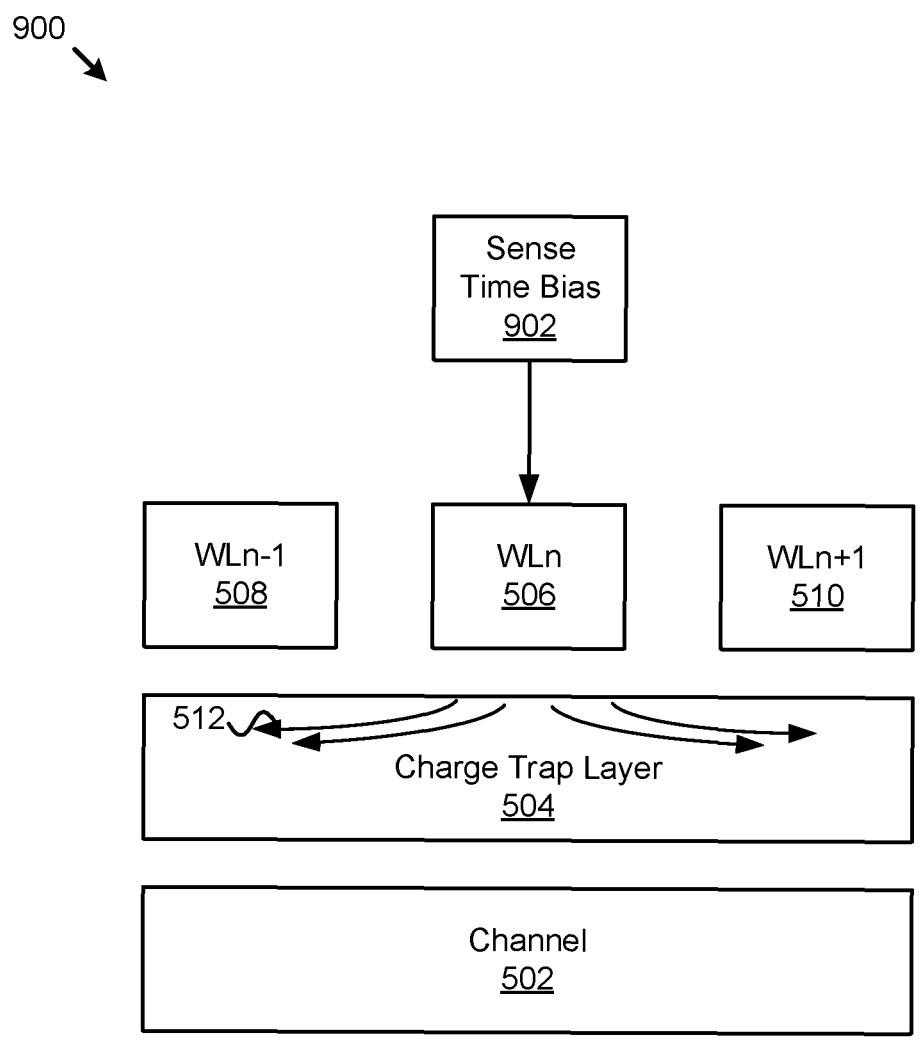
FIG. 9 is a schematic block diagram illustrating another embodiment of state-dependent read compensation.

Turning to FIG. 9, one embodiment of a device 900 is illustrated in which a sense time bias 902 is used to read the first word line 506. In such an embodiment, the sense time bias 902 may be used in conjunction with a nominal sense time to result in a total sense time. In some embodiments, the sense time bias 902 may be a time in a range of approximately −600 to −450 nanoseconds ("ns"), −500 to −150 ns, and/or −250 to 0 ns. In certain embodiments, the sense time bias 902 may be lower when word lines adjacent to a target word line are in an erase state resulting in a lower total sense time than a nominal sense time. In one embodiment, the sense time bias 902 may be zero while word lines adjacent to the word line are in an erase state, such that the total sense time matches the nominal sense time.

Figure 7:
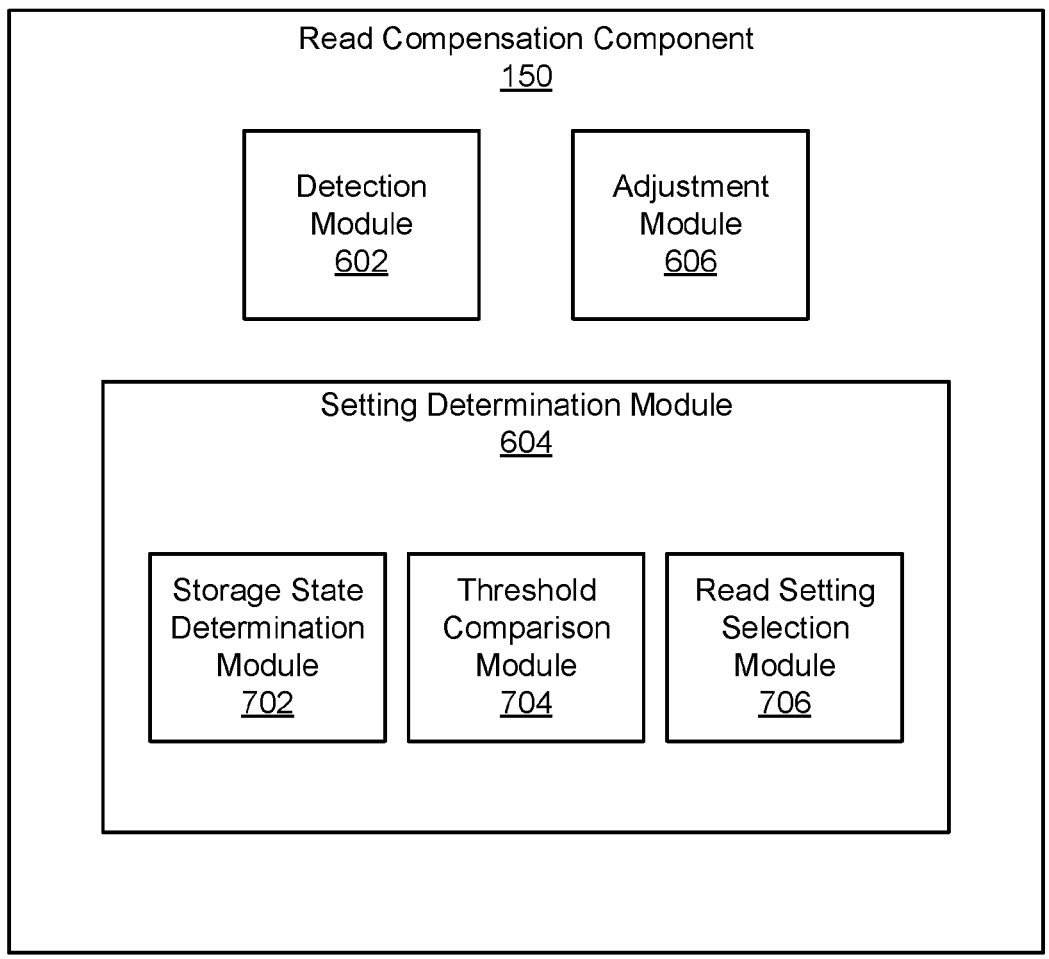
FIG. 7 is a schematic block diagram illustrating a further embodiment of a read compensation component.

Returning to FIG. 7, a further embodiment of a read compensation component 150 is illustrated. The read compensation component 150 may be substantially similar to the read compensation component 150 described above with regard to FIGS. 1A, 1B, 2, 3, and/or 6. In the depicted embodiment, the read compensation component 150 includes the detection module 602, the setting determination module 604, and the adjustment module 606 and further includes a storage state determination module 702, a threshold comparison module 704, and a read setting selection module 706.

In one embodiment, the storage state determination module 702 determines a storage state of storage cells of one or more word lines based on one or more reads. For example, in one embodiment, the storage state determination module 702 determines whether storage cells of a word line are in an erase state by performing one read. In another example, the storage state determination module 702 determines a storage state of storage cells of the word line by performing three reads, seven reads, and so forth.

In certain embodiments, the threshold comparison module 704 determines a storage state of a word line by detecting what storage state a majority of storage cells of the word line are in. In various embodiments, the threshold comparison module 704 determines the storage state of a word line by detecting whether a threshold number of storage cells of the word line are in a storage state, such as an erase state. The threshold number may be any suitable number. For example, the threshold number may be approximately 50 percent, 75 percent, and/or 90 percent. In certain embodiments, the read setting selection module 706 selects the read setting based on the result of the threshold comparison module 704. The read setting selection module 706 may select a suitable bias voltage, and/or a sense time bias.

Figure 10:
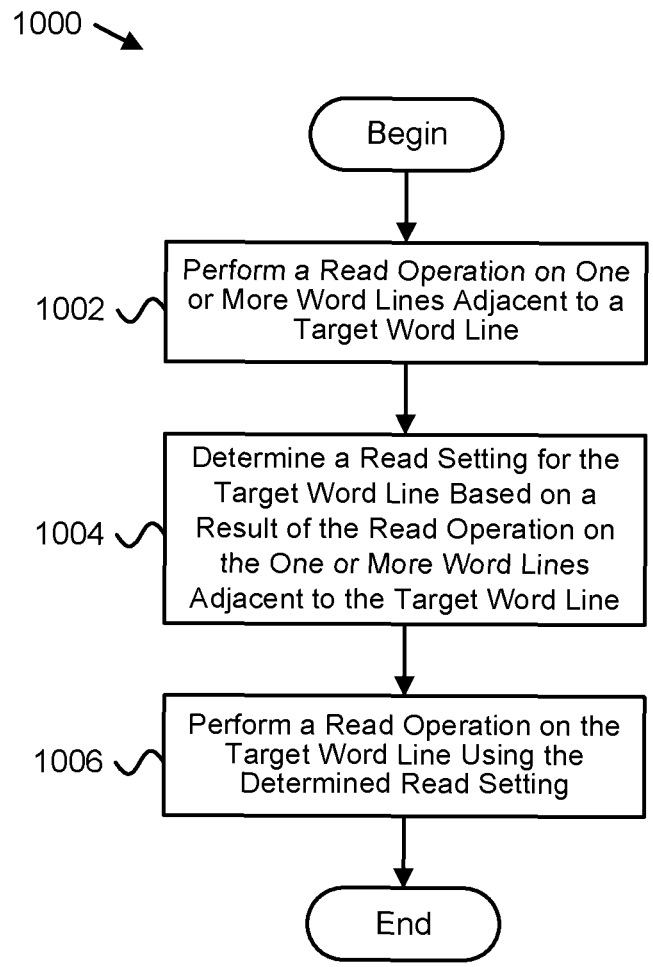
FIG. 10 is a schematic flow chart diagram illustrating one embodiment of a method for state-dependent read compensation.

FIG. 10 depicts one embodiment of a method 1000 for state-dependent read compensation. The method 1000 may be performed at any point in time, such as at predetermined intervals for calibrating and/or recalibrating a block of non-volatile storage cells. For example, the method 1000 may be performed at a predetermined interval of every 200 read cycles. The method 1000 may also be performed as part of each read.

The method 1000 begins and the detection module 602 performs 1002 a read operation on one or more word lines adjacent to a target word line. The setting determination module 604 determines 1004 a read setting for application to the target word line based on a result of the read operation on the one or more word lines adjacent to the target word line. The adjustment module 606 performs 1006 a read operation on the target word line using the determined read setting, and the method 1000 ends.

Figure 11:
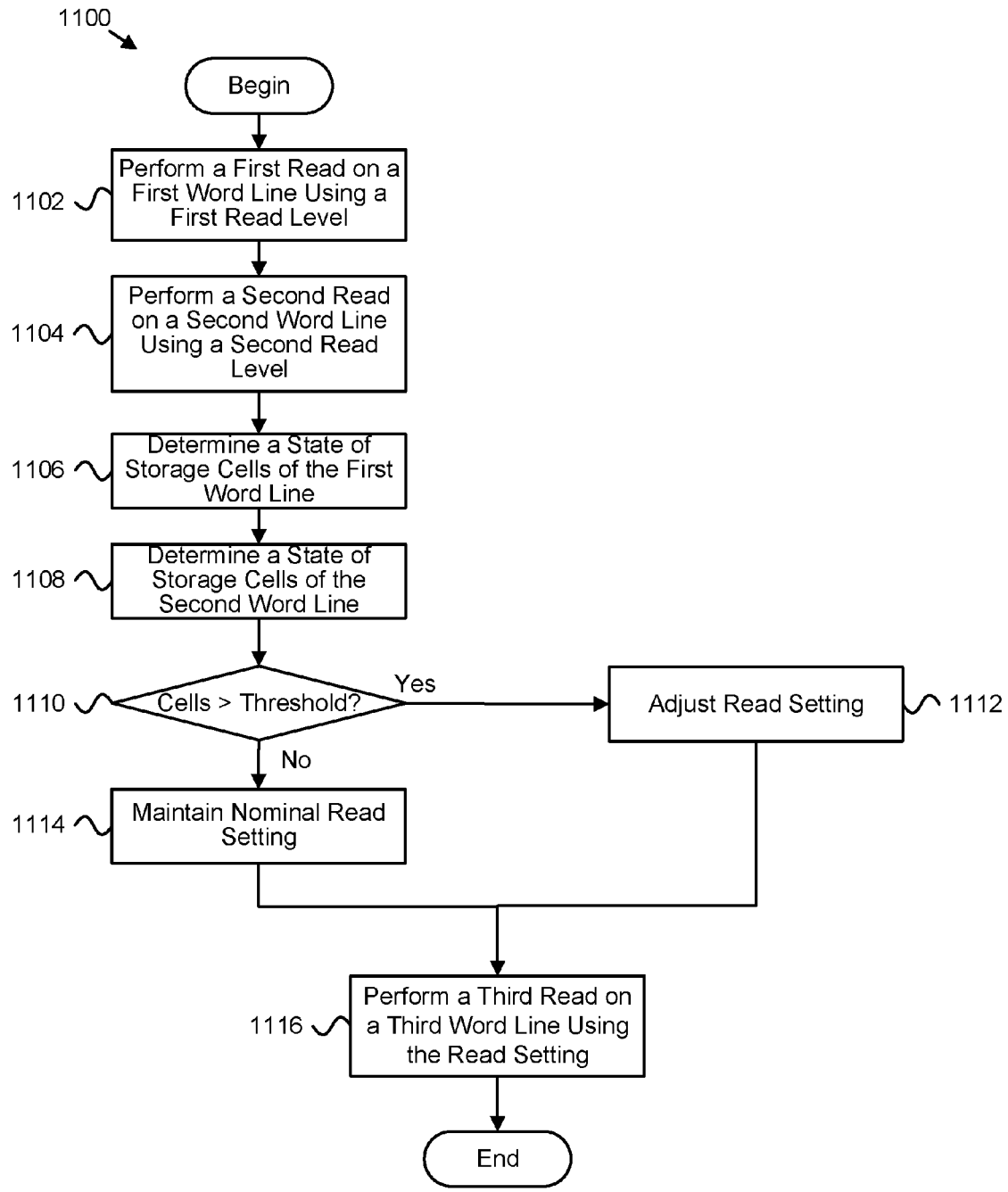
FIG. 11 is a schematic flow chart diagram illustrating a further embodiment of a method for state-dependent read compensation.

FIG. 11 is a schematic flow chart diagram illustrating a further embodiment of a method 1100 for state-dependent read compensation. The method 1100 begins, and the detection module 602 performs 1102 a first read on a first word line using a first read level. Moreover, the detection module 602 performs 1104 a second read on a second word line using a second read level. In some embodiments, performing the first read overlaps in time with performing the second read. The setting determination module 604 determines 1106 a storage state of storages cells of the first word line and determines 1108 a storage state of storage cells of the second word line.

The setting determination module 604 determines 1110 whether a number storage cells having a storage state below a selected storage state is greater than a predetermined threshold. In some embodiments, the selected storage state may be an erase state, while in other embodiments, the selected storage state may include the erase state and one or more additional low storage states. If the number of storage cells is greater than the predetermined threshold, the setting determination module 604 adjusts 1112 a read setting for a third word line. If the number of storage cells is less than the predetermined threshold, the setting determination module 604 maintains 1114 a nominal read setting for the third word line. In certain embodiments, the first word line is adjacent to the third word line, and the third word line is adjacent to the second word line. Then, the adjustment module 606 performs 1116 a third read on the third word line using the read setting, and the method 1100 ends.

A means for performing a first read on a first set of cells physically adjacent to a selected set of cells, in various embodiments, may include a read compensation component 150, a detection module 602, a non-volatile storage device interface 139, a non-volatile memory medium controller 126, a storage client 116, a database system 116a, a host computing device 110, a bus 127, a network 115, a device driver, a controller (e.g., a device driver, or the like) executing on a host computing device 110, a processor 111, other logic hardware, and/or other executable code stored on a computer readable storage medium. Other embodiments may include similar or equivalent means for performing a first read on a first set of cells physically adjacent to a selected set of cells. In certain embodiments, the first set of cells share a charge trapping layer with the selected set of cells.

A means for determining one or more of a sense time and a source voltage for a second read on the selected set of cells based on the first read, in various embodiments, may include a read compensation component 150, a setting determination module 604, a non-volatile storage device interface 139, a non-volatile memory medium controller 126, a storage state determination module 702, a threshold comparison module 704, a read setting selection module 706, a storage client 116, a database system 116a, a host computing device 110, a bus 127, a network 115, a device driver, a controller (e.g., a device driver, or the like) executing on a host computing device 110, a processor 111, other logic hardware, and/or other executable code stored on a computer readable storage medium. Other embodiments may include similar or equivalent means for determining one or more of a sense time and a source voltage for a second read on the selected set of cells based on the first read.

A means for performing the second read on the selected set of cells using the determined one or more of the sense time and the source voltage, in various embodiments, may include a read compensation component 150, an adjustment module 606, a non-volatile storage device interface 139, a non-volatile memory medium controller 126, a storage client 116, a database system 116a, a host computing device 110, a bus 127, a network 115, a device driver, a controller (e.g., a device driver, a state machine, an FPGA, an ASIC, or the like) executing on a host computing device 110, a processor 111, other logic hardware, and/or other executable code stored on a computer readable storage medium. Other embodiments may include similar or equivalent means for performing the second read on the selected set of cells using the determined one or more of the sense time and the source voltage.

A means for determining whether the first set of cells adjacent to the selected set of cells are in an erase state, in various embodiments, may include a read compensation component 150, an adjustment module 606, a non-volatile storage device interface 139, a non-volatile memory medium controller 126, a storage client 116, a database system 116a, a host computing device 110, a bus 127, a network 115, a device driver, a controller (e.g., a device driver, a state machine, an FPGA, an ASIC, or the like) executing on a host computing device 110, a processor 111, other logic hardware, and/or other executable code stored on a computer readable storage medium. Other embodiments may include similar or equivalent means for determining whether the first set of cells adjacent to the selected set of cells are in an erase state.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    a set of non-volatile storage cells comprising a plurality of word lines; and
    a controller configured to:
        perform a read operation on one or more word lines adjacent to a target word line;
        determine a read setting for application to the target word line based on a result of the read operation on the one or more word lines adjacent to the target word line, wherein the read setting comprises a sense time, and the sense time is set lower than a nominal sense time; and
        perform a read operation on the target word line using the determined read setting.

2. The apparatus of claim 1, wherein a first storage state of the one or more word lines adjacent to the target word line differs from a second storage state of the target word line by a threshold number of states.

3. The apparatus of claim 2, wherein the first storage state of the one or more word lines adjacent to the target word line comprises an erased state and a second storage state of the target word line is a programmed state.

4. The apparatus of claim 1, wherein the read setting comprises a plurality of sense times for different bit lines for storage cells of the target word line.

5. The apparatus of claim 1, wherein determining the read setting comprises detecting that at least a threshold number of storage cells of the one or more word lines adjacent to the target word line are in an erase state based on the one or more read operations.

6. The apparatus of claim 1, wherein the read setting comprises a cell source voltage.

7. The apparatus of claim 6, wherein the cell source voltage is set higher than a nominal cell source voltage level in response to detecting that at least a threshold number of storage cells of one or more of the first word line and the second word line are in an erase state.

8. The apparatus of claim 1, wherein the read setting comprises a bit line bias voltage for storage cells of the target word line.

9. The apparatus of claim 1, wherein the read setting comprises a plurality of bit line bias voltages concurrently applied to different storage cells of the target word line.

10. A method comprising:
    performing a first read on a first word line using a first read level;
    performing a second read on a second word line using a second read level, wherein performing the first read overlaps in time with performing the second read;
    determining a read setting for application to a third word line for a third read on the third word line based at least partially on results of the first and second reads, wherein the first word line is adjacent to the third word line, and the third word line is adjacent to the second word line; and performing the third read on the third word line using the read setting;

wherein performing the first read on the first word line using the first read level and performing the second read on the second word line using the second read level comprise concurrently applying a first read voltage to the first and second word lines and a second read voltage to at least the third word line.

11. The method of claim 10, wherein the first read level and the second read level are the same.

12. The method of claim 10, wherein one or more of performing the first read and performing the second read comprises performing a plurality of reads using a plurality of read levels to detect a storage state of storage cells.

13. The method of claim 10, wherein performing the first read on the first word line using the first read level comprises determining whether storage cells of the first word line are in an erase state, and performing the second read on the second word line using the second read level comprises determining whether storage cells of the second word line are in the erase state.

14. The method of claim 10, wherein performing the first read on the first word line using the first read level comprises concurrently applying a first read voltage to the first word line and a second read voltage to at least the second and third word lines, and performing the second read on the second word line using the second read level comprises concurrently applying the first read voltage to the second word line and the second read voltage to at least the first and third word lines.

15. The method of claim 10, wherein determining the read setting for the third read on the third read line comprises determining a first read setting for a first set of storage cells of the third word line having two adjacent storage cells in an erase state, determining a second read setting for a second set of storage cells of the third word line having one adjacent storage cell in the erase state, and determining a third read setting for a third set of storage cells of the third word line having two adjacent storage cells in a programmed state.

16. The method of claim 15, wherein performing the third read on the third word line using the read setting comprises performing a first part of the third read on the first set of storage cells using the first read setting, performing a second part of the third read on the second set of storage cells using the second read setting, and performing a third part of the third read on the third set of storage cells using the third read setting.

17. An apparatus comprising:

means for performing a first read on a first set of cells physically adjacent to a selected set of cells, the first set of cells sharing a charge trapping layer with the selected set of cells;

means for determining one or more of a sense time and a source voltage for a second read on the selected set of cells based on the first read; and means for performing the second read on the selected set of cells using the determined one or more of the sense time and the source voltage.

18. The apparatus of claim 17, wherein the means for performing the first read on the first set of cells adjacent to the selected set of cells comprises means for determining whether the first set of cells adjacent to the selected set of cells are in an erase state.

* * * * *